United States Patent
Ramachandran et al.

(10) Patent No.: US 8,513,626 B2
(45) Date of Patent: *Aug. 20, 2013

(54) METHOD AND APPARATUS FOR REDUCING PATTERNING EFFECTS ON A SUBSTRATE DURING RADIATION-BASED HEATING

(75) Inventors: Balasubramanian Ramachandran, Santa Clara, CA (US); Joseph Michael Ranish, San Jose, CA (US); Aaron Muir Hunter, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1382 days.

This patent is subject to a terminal disclaimer.

(21) Appl. No.: 11/622,908

(22) Filed: Jan. 12, 2007

(65) Prior Publication Data

US 2008/0171417 A1    Jul. 17, 2008

(51) Int. Cl.
*G02B 5/00* (2006.01)
(52) U.S. Cl.
USPC ............... 250/492.3; 250/492.1; 250/492.2; 250/492.21; 359/350; 359/359
(58) Field of Classification Search
USPC .......... 250/492.1, 492.2, 506.1, 507.1, 316.1, 250/492.21, 492.3; 359/350, 358, 359
See application file for complete search history.

(56) References Cited

U.S. PATENT DOCUMENTS

| | | | | |
|---|---|---|---|---|
| 4,939,424 A | * | 7/1990 | Kieser et al. | 315/111.21 |
| 5,475,201 A | * | 12/1995 | Pike | 219/497 |
| 5,608,227 A | * | 3/1997 | Dierks et al. | 250/492.1 |
| 5,762,419 A | * | 6/1998 | Yam | 374/2 |
| 6,281,511 B1 | * | 8/2001 | Thakur | 250/492.2 |
| 7,015,422 B2 | | 3/2006 | Timans | |
| 7,642,527 B2 | | 1/2010 | Marson et al. | |
| 2003/0235972 A1 | * | 12/2003 | Hosokawa | 438/530 |
| 2004/0140432 A1 | * | 7/2004 | Maldonado et al. | 250/423 P |
| 2005/0017175 A1 | * | 1/2005 | Lee et al. | 250/338.1 |
| 2005/0120961 A1 | * | 6/2005 | Kubo | 118/728 |
| 2005/0227422 A1 | * | 10/2005 | Nakamura et al. | 438/166 |
| 2006/0286820 A1 | | 12/2006 | Singh et al. | |
| 2010/0076111 A1 | * | 3/2010 | Marson et al. | 522/153 |

* cited by examiner

*Primary Examiner* — Robert Kim
*Assistant Examiner* — Hanway Chang
(74) *Attorney, Agent, or Firm* — Patterson & Sheridan, LLP

(57) ABSTRACT

Patterning effects on a substrate are reduced during radiation-based heating by filtering the radiation source or configuring the radiation source to produce radiation having different spectral characteristics. For the filtering, an optical filter may be used to truncate specific wavelengths of the radiation. The different configurations of the radiation source include a combination of one or more continuum radiation sources with one or more discrete spectrum sources, a combination of multiple discrete spectrum sources, or a combination of multiple continuum radiation sources. Furthermore, one or more of the radiation sources may be configured to have a substantially non-normal angle of incidence or polarized to reduce patterning effects on a substrate during radiation-based heating.

15 Claims, 10 Drawing Sheets

METHOD AND APPARATUS FOR REDUCING PATTERNING EFFECTS ON A SUBSTRATE DURING RADIATION-BASED HEATING

BACKGROUND OF THE INVENTION

1. Field of the Invention

Embodiments of the present invention generally relate to thermal processing of a substrate and more particularly to method and apparatus for reducing patterning effects on a substrate during radiation-based heating.

2. Description of the Related Art

Some methods of thermal processing of substrates, such as rapid thermal processing (RTP) or laser thermal processing (LTP), rely on radiation-based heating of substrates. For example, RTP is performed on a silicon wafer for the manufacture of integrated circuits by heating a wafer using high-output lamps, such as halogen lamps. The wafer is heated for a short time to a peak temperature, often on the order of 800 to 1000 degrees Celsius, for the formation of a layer of oxide, nitride, or silicide on the wafer, or to anneal an implanted wafer.

Substrate temperatures achieved in radiation-based heating strongly depend on the amount of incident radiation absorbed by the substrate. Even with completely uniform irradiance of a substrate, regions of the substrate surface having different reflectivities will experience different amounts of energy input per unit surface area, and consequently will heat up to different temperatures during the thermal process. Different reflectivities are typically present on a substrate surface because substrates that undergo radiation-based heating processes generally have a heterogeneous surface consisting of multiple material and feature types, rather than a surface covered by a uniform blanket film. This variation in reflectivity and heating rate is known as a patterning effect.

Heterogeneous substrate surfaces that generate such thermal patterning effects are produced by the disparate materials used in the construction of integrated circuits. For example, the surface of an integrated circuit (IC), also referred to as an "IC die" prior to being cut from a silicon wafer, may include a number of different materials during thermal processing, such as silicon oxides, silicon nitrides, metal silicides, and metals. Each material may have different optical properties, e.g., reflectivity, absorptivity, and emissivity, and therefore each material will absorb incident radiation at different rates. The mass of such surface materials is very small compared to mass of the underlying substrate, therefore the heat capacity of every region of the substrate is essentially the same. But because energy input can vary substantially between different regions of an IC die, significant temperature gradients may occur therebetween during thermal processing, for example on the order of 10's or even 100's of degrees Celsius. Conductive heat transfer from "hot spots" to "cold spots" on the substrate generally cannot adequately ameliorate these gradients due to the short duration of radiation-based heating processes.

When a light ray encounters a material, it is either reflected off the surface of the material, absorbed by the material, or transmitted through the material. Therefore, the fraction of radiative energy absorbed by the material is equal to (1—fraction of energy reflected—fraction of energy transmitted). In the case of a silicon-based substrate which is at or above about 500 degrees Celsius and which is illuminated with infra-red (IR) radiation, the energy absorbed by the substrate is simply equal to (1—fraction of energy reflected). This is because silicon-based substrates, such as silicon wafers, are essentially opaque to IR radiation at this temperature, i.e., incident IR radiation is either reflected or absorbed by the substrate and none is transmitted. The fraction of energy absorbed by the substrate is known to be a function of wavelength, polarization, and incidence angle of the illuminating radiation.

FIG. 1A is a graph illustrating the dependence of the energy absorption of a material on the wavelength and incidence angle of illuminating radiation. In this example, the material in question is a film stack deposited on a silicon wafer consisting of a 57 nm film of polysilicon on a 170 nm film of silicon dioxide. A family of absorption curves 110 consists of absorption curves 111-115, each of which represents one absorption curve for this film stack. As used herein, "absorption curve" is defined as the fraction of incident energy absorbed by a material described as a function of the wavelength of the incident energy.

Absorption curves 111-115 represent the different absorption curves for radiant energy that is incident to the absorbing material at 0°, 22.5°, 45°, 67.5°, and 85°, respectively, wherein 0° is defined as normal to the absorbing material. The weighted average fraction of energy absorbed by the material, i.e., the effective absorptivity of the material, may be quantified by integrating each of the absorption curves 111-115 over wavelength weighted by the source spectrum to produce a total absorbed energy for each angle of incidence. The absorbed energy for each curve is then is weighted based on the angular distribution of the incident energy, and the weighted energy totals for each absorption curve are then summed. For example, for a highly uni-directional and normally incident radiation source, such as a laser beam oriented normal to a material surface, absorption curve 111 is weighted to contain 100% of the energy absorbed. This is because absorption curve 111 corresponds to the absorption curve for normal incidence. For more diffuse radiation sources, the absorption curves 112-115, which represent the absorption of radiation at non-normal angles of incidence, are weighted appropriately to accurately reflect the directionality of the radiation source.

FIG. 1B illustrates the spectral power distribution curve 163 for a typical continuum radiator, also referred to as a radiation source, at a standard operating temperature. The abscissa represents the wavelength, in micrometers (μm), of the radiation produced by the continuum radiator. The ordinate represents the exittance of the continuum radiator, i.e., the power per unit area of the radiation source per wavelength of the incident radiation. As can be seen in FIG. 1B, the majority of energy produced by the radiation source occurs in the IR bandpath, i.e., the spectrum of wavelengths between about 0.2 μm and about 4.0 μm. It is noted that the energy so produced is distributed over a continuum of frequencies rather than concentrated at a few discrete frequencies. Further, the spectral power distribution for this continuum radiator is not flat, i.e., more energy produced by the radiator is concentrated in certain wavelengths over other wavelengths, producing a non-uniform spectral power distribution. In the example shown in FIG. 1B, energy output of the continuum radiator is much higher in a peak region 160 of the spectrum than in tail regions 161, 162. Such a non-uniform spectral power distribution is typical for continuum radiators. A common continuum radiator used for radiation-based thermal processing is a tungsten halogen lamp.

Referring back to FIG. 1A, it is noted that, for any given material or film stack, family of absorption curves 110 will be different, i.e., the weighted average fraction of energy absorbed by each material is unique. This difference in absorptive behavior between different materials is a root cause for the patterning effects described above. FIG. 1C schematically illustrates a partial cross-section of a silicon substrate 120 having a source/drain region 121 formed on surface 122 and consisting of crystalline silicon. Silicon substrate 120 also has a film stack region 123 formed on surface 122 and adjacent source/drain region 121, wherein film stack region 123 consists of a polysilicon/silicon film stack as described above in conjunction with FIG. 1A and family of absorption curves 110. Because source/drain region 121 and film stack region 123 are very small features adjacent each other on silicon substrate 120, they receive an essentially identical angular distribution of incident energy 125 during radiation-based thermal processing. Total energy absorbed by source/drain region 121 and film stack region 123 may be substantially different, however. This is because the family of absorption curves for source/drain region 121 may be significantly different than family of absorption curves 110 for film stack region 123. For example, referring back to FIG. 1A, family of absorption curves 110 indicates a low absorption bandpath 116 for wavelengths between about 0.75 μm and about 1.5 μm for film stack region 123. If, in contrast, source/drain region 121 absorbs a higher faction of incident energy over the same wavelengths, source/drain region 121 may absorb much more energy than film stack region 123 during radiation-based heating and therefore experience higher temperatures.

For an integrated circuit or other electronic device undergoing thermal processing, it is desirable for every region of the device to experience the same thermal process, particularly temperature. Thermal gradients across a device caused by patterning effects can result in non-uniform electrical properties on the device, which strongly influence the overall device performance. In some cases, such unwanted thermal gradients may even render the device unusable or less reliable due to incomplete thermal processing in some parts of the device and over-processing in others. In regions corresponding to "cold spots" on the device, important processes may not be completed, such as post-implant anneal. In regions corresponding to "hot spots", a device may be detrimentally affected in other ways, for example from unwanted diffusion of implanted atoms into the substrate or by exceeding the thermal budget of devices formed in that region.

Methods commonly used in the art of radiation-based heating of substrates only address temperature gradients that occur on a global scale between different regions of a substrate. For example, an annular edge region of a circular substrate may have a tendency to heat more slowly than a center region of the substrate. In order to compensate for this tendency and, therefore, to improve the macroscopic temperature uniformity of the substrate, an array of lamps positioned adjacent the annular edge region may provide an increased energy output relative to centrally positioned lamps. While this approach may reduce temperature gradients across the substrate as a whole, temperature gradients within a single IC die caused by patterning effects will remain unaffected. This is because the scale of intra-die temperature gradients, which is on the order of micrometers, is far too small for different configurations of lamp arrays to correct. Moreover, modulation of the intensity of incident radiation during radiation-based heating is also unable to thermal reduce patterning effects since this method does not address the fundamentally different optical characteristics of different regions on the surface of a substrate.

SUMMARY OF THE INVENTION

In view of the above, embodiments of the present invention provide an apparatus and a method for reducing patterning effects on a substrate during radiation-based heating by filtering the radiation source or configuring the radiation source to produce radiation having different spectral characteristics. For filtering, an optical filter may be used to truncate specific wavelengths of the radiation. The different configurations of the radiation source include a combination of one or more continuum radiation sources with one or more discrete spectrum sources, a combination of multiple discrete spectrum sources, or a combination of multiple continuum radiation sources. Furthermore, one or more of the radiation sources may be configured to have a substantially non-normal angle of incidence or may be polarized to reduce patterning effects on a substrate during radiation-based heating.

In one embodiment, a method for thermally processing a substrate comprises positioning a substrate in a chamber having a radiation source and a window through which radiation from the radiation source enters the chamber. The method further comprises activating the radiation source to generate radiation, filtering certain wavelengths of radiation before the radiation reaches the substrate, and thermally processing the substrate with the filtered radiation. A coating on the window may be used to filter the radiation.

In another embodiment, a method for thermally processing a substrate comprises positioning the substrate in a chamber having multiple radiation sources, wherein each radiation source produces radiation with different spectral characteristics. The method further comprises activating the radiation sources to generate radiation having different spectral characteristics and thermally processing the substrate with the incident radiation. The radiation sources may include one or more discrete radiators, one or more continuum radiators, or combinations thereof.

In another embodiment, a substrate processing apparatus comprises a thermal processing chamber, a radiation source for producing radiation in the direction of the substrate, and an optical filter positioned between the radiation source and the substrate for filtering certain wavelengths of the radiation before the radiation reaches the substrate. A coating on a window positioned between the radiation source and the substrate may be used to filter the radiation.

In another embodiment, a substrate processing apparatus comprises a thermal processing chamber and multiple radiation sources for producing radiation having different spectral characteristics in the direction of the substrate. The radiation sources may include one or more discrete radiators, one or more continuum radiators, or combinations thereof. The radiation sources may comprise a first radiation source subject to a first polarization and a second radiation source subject to a second polarization.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures. It is contemplated that features of one embodiment may be incorporated in other embodiments without further recitation.

DETAILED DESCRIPTION

Typically in the art of radiation-based thermal processing of substrates, a single optimal radiation source type is selected for a particular thermal process. Embodiments of the invention contemplate the use of multiple radiation sources of different spectral characteristics to minimize the variation in absorbed power between different regions of a substrate surface, for example, between different regions of an IC die.

Figure 2A:
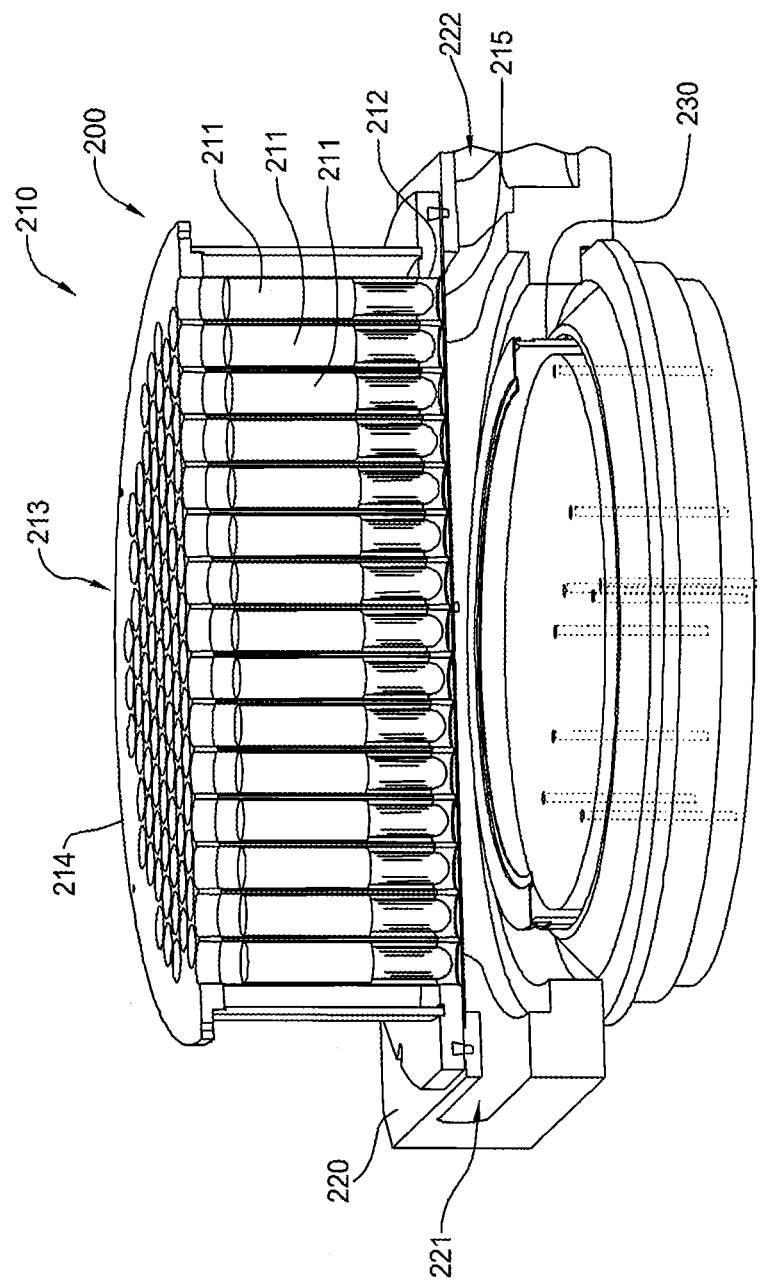
FIG. 2A is a partial perspective diagram of a radiation-based thermal processing chamber that may incorporate embodiments of the invention.

FIG. 2A is a partial perspective diagram of an exemplary radiation-based thermal processing chamber, in this case an RTP chamber, that may incorporate embodiments of the invention. The RTP chamber, hereinafter referred to as chamber 200, has been cross-sectioned for clarity. The chamber 200 generally consists of a lamp assembly 210, a chamber body 220 and a substrate support assembly 230. For clarity, only the upper portion of chamber body 220 is illustrated in FIG. 2A.

Lamp assembly 210 includes a plurality of radiation sources 211, each of which may be positioned inside a reflective light pipe 212. The radiation sources 211 are preferably high output lamps in order to heat substrates to the temperatures desired in thermal processes. Generally, lamp output may be varied up to about 500 W per lamp. Together, the reflective light pipes 212 form a honeycomb array 213 inside a water-cooled housing 214. A thin quartz window 215 forms the bottom surface of lamp assembly 210, separating lamp assembly 210 from the vacuum or atmosphere usually present in chamber 200. Lamp assembly 210 is preferably attached to the upper surface of chamber body 220 in a vacuum-tight manner.

Chamber body 220 includes the walls and floor of chamber 200 as well as a substrate opening 221 and exhaust opening 222. Substrates are delivered into and removed from chamber 200 through substrate opening 221 by means known in the art, for example by one or more substrate-handling robots (not shown). A vacuum pump (not shown) may evacuate chamber 200 through exhaust opening 222 to achieve a desired level of vacuum in chamber 200 during substrate processing. Openings in the chamber (not shown) may provide entry for various types of process gases. Slit or gate valves (not shown) may be used to seal substrate opening 221 and exhaust opening 222 when necessary.

The substrate support assembly 230 is contained inside chamber body 220 and during substrate processing may support a substrate (not shown for clarity) approximately 25 mm below quartz window 215. Substrate support assembly 230 may rotate between about 50 rpm and about 300 rpm during substrate processing to maximize macroscopic temperature uniformity of the substrate during processing by minimizing the effect of thermal asymmetries in chamber 200 on the substrate.

Operation of all aspects of chamber 200, including control of radiation source and actuation of valves and substrate handling robots, are timed and managed by a computer or programmable logic controller, typically referred to as a system controller (not shown). In some cases the system controller is dedicated to operating only a particular RTP chamber, in other cases, it may be used to operate and coordinate all chambers, sensors and substrate transfer robots positioned on a complete substrate processing system.

As noted above, radiation sources 211 may include continuum radiators, discrete spectrum sources, or a combination of both. Examples of continuum radiators used by embodiments of the invention include solid incandescent sources, such as tungsten halogen lamps, carbon filament lamps, or ribbon lamps, and gaseous incandescent sources, such as pressurized zenon, krypton, or argon lamps. Examples of useful discrete spectrum sources include atomic emission sources such as low pressure sodium lamps, mercury lamps, or metal halide lamps. Discrete spectrum sources may also include the use of mercury lamps or metal halide lamps wherein the spectrum is controlled by controlling the lamp cold spot. Light-emitting diodes (LED's) and lasers are another discrete spectrum source contemplated by the invention.

Figure 2B:
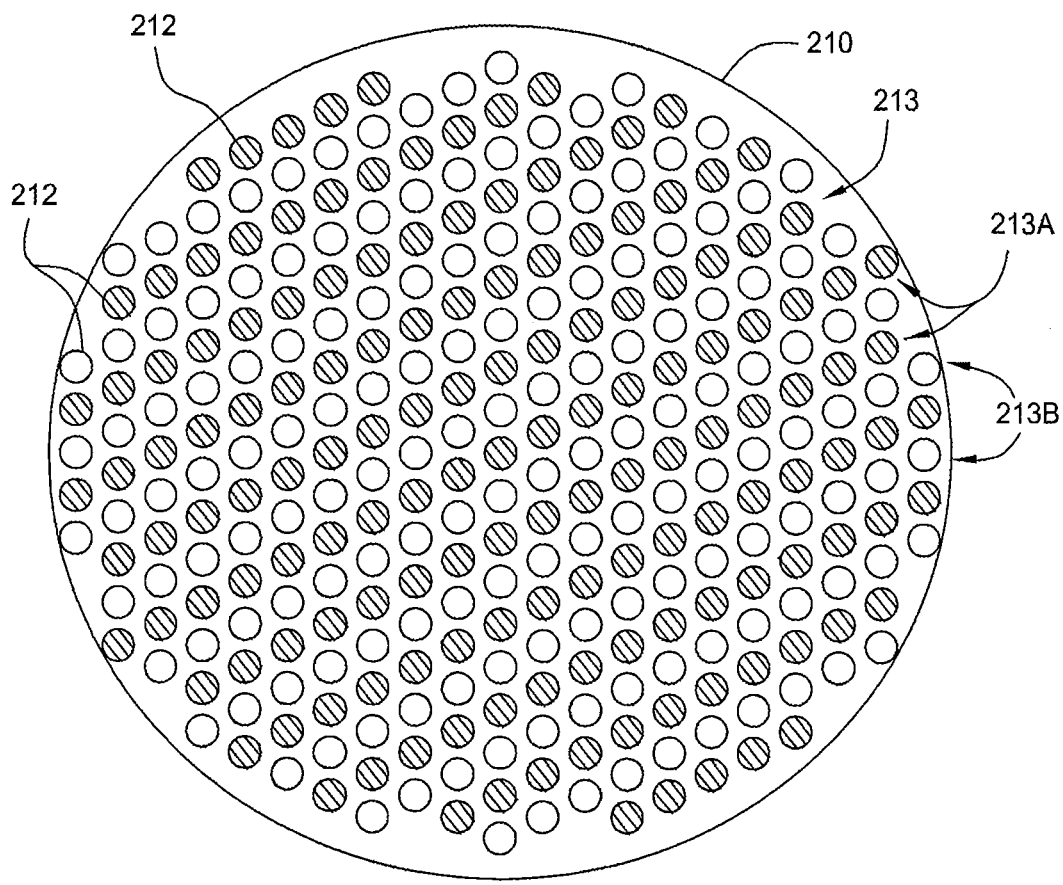
FIG. 2B is a plan view of a honeycomb array of radiation sources according an embodiment of the invention.

FIG. 2B is a plan view of honeycomb array 213 according to an embodiment of the invention. Honeycomb array 213 includes a plurality of reflective light pipes 212, each of which contains a radiation source. In the example shown, the reflective light pipes 212 are divided into two groups: a first array 213A and a second array 213B. First array 213A includes all reflective light pipes that are cross-hatched in FIG. 2B and second array 213B includes all reflective light pipes that are not cross-hatched in FIG. 2B. In one configuration, each reflective light pipe 212 in first array 213A contains a continuum radiator, and each reflective light pipe 212 in second array 213B contains a discrete spectrum radiator. In another configuration, each reflective light pipe 212 in first array 213A contains a continuum radiator having a first spectral power distribution and each reflective light pipe 212 in second array 213B contains a radiator having a second spectral power distribution. In yet another configuration, each reflective light pipe 212 in first array 213A contains a first discrete spectrum radiator and each reflective light pipe 212 in second array 213B contains a second discrete spectrum radiator having a second spectral power distribution, wherein the first and second discrete spectrum radiators produce radiation at different wavelengths.

Embodiments of the invention also contemplate other configurations of honeycomb array 213. In one embodiment, the arrangement of light pipes 212 belonging to first array 213A and second array 213B may be organized differently than illustrated in FIG. 2B. For example, first array 213A and second array 213B may be organized as alternating concentric rings to promote macroscopic temperature uniformity of processed substrates. Alternatively, first array 213A and second array 213B may instead be organized in radial "spoke-shaped" regions for the same reason. Further, honeycomb array 213 may be divided into three or more sub-arrays rather than the two sub-arrays shown in FIG. 2B, i.e., first array 213A and second array 213B. Having honeycomb array 213 divided into three or more sub-arrays allows more flexibility in the selection of radiation sources. For example, with a three sub-array configuration, an embodiment having one continuum radiation source and two discrete radiation sources, or vice-versa, may be implemented in chamber 200. Finally, within any one type of lamp, the array may be divided so as to provide a radial variation of radiated power.

Figure 3A:
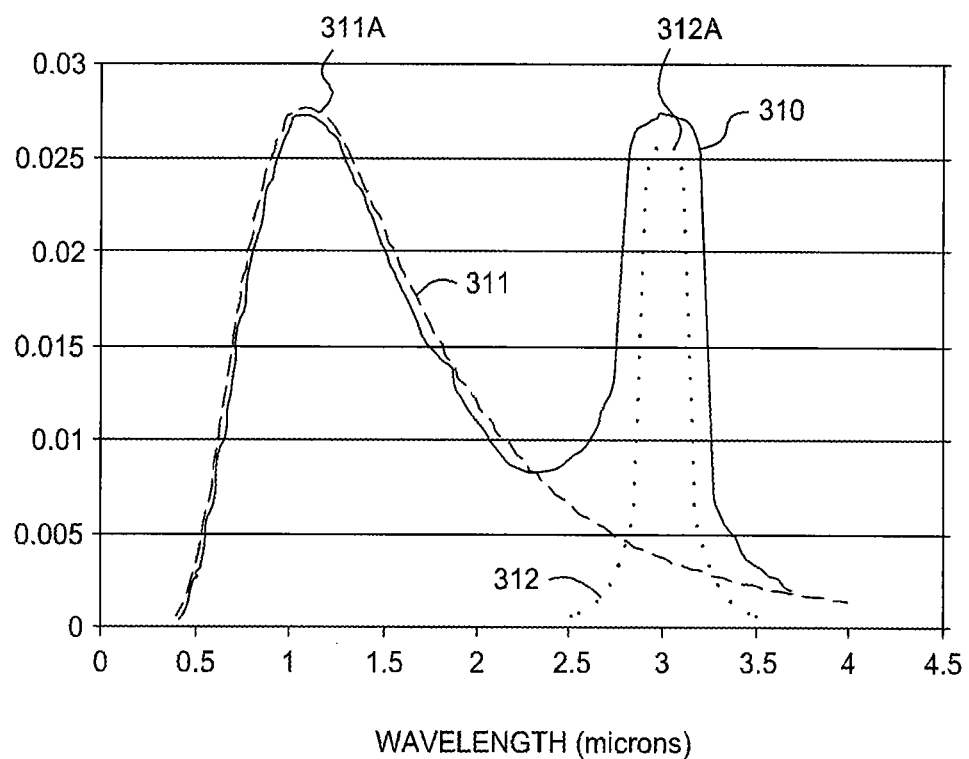
FIG. 3A illustrates a resultant spectral power distribution curve for a combination of radiation sources.

In one embodiment, the spectral power distribution of incident radiation is adjusted during thermal processing by combining continuum radiation sources with discrete spectrum sources. In so doing, the weighted average fraction of energy absorbed by different materials on the same substrate may be made substantially equal, thereby reducing or eliminating thermal patterning effects. For example, an array of conventional tungsten halogen lamps may be combined with an array of low-pressure sodium lamps to thermally process a substrate having two or more materials exposed on its surface. FIG. 3A illustrates the resultant spectral power distribution curve 310 for a combination of two radiation sources. Spectral power distribution curve 310 is the sum of spectral power distribution curve 311 for tungsten halogen lamps and spectral power distribution curve 312 for a discrete source lamp. Spectral power distribution curve 310 may be tailored to minimize the difference in the weighted average fraction of energy absorbed between each material on the surface of the substrate. Namely, if a first material on the substrate surface absorbs a higher fraction of energy in a bandpath relative to a second surface material, and if this bandpath corresponds to the peak output 311A of the tungsten halogen lamp array, then the heating rate of the first material will be substantially higher than that of the second material if only tungsten halogen lamps are used for thermal processing. By selecting a second radiation source having a different spectral power distribution, i.e., spectral power distribution curve 312, the heating rate of the second material on the substrate surface may be increased to that of the first material, thereby reducing thermal patterning effects. A second radiation source should be selected which has a spectral power distribution that will compensate for the lower heating rate of the second material, i.e., the peak output 312A should correspond to a wavelength that is preferentially absorbed by the second material relative to the first.

Figure 3B:
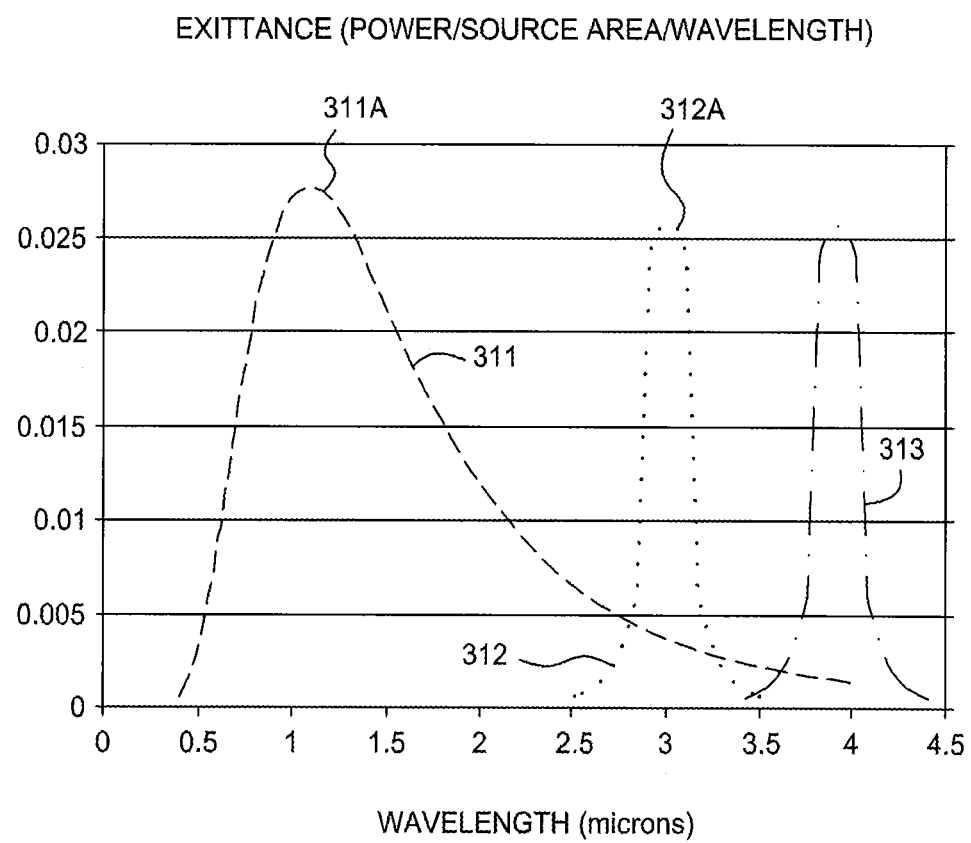
FIG. 3B illustrates the spectral power distribution curves for another combination of radiation sources.

In one aspect, multiple discrete radiation sources may be combined with a continuum radiation source to produce a desired spectral power distribution for thermal processing. FIG. 3B illustrates the spectral power distribution curves for one example of this aspect. In addition to spectral power distribution curve 311 for a continuum radiation source and spectral power distribution curve 312 for a first discrete radiation source, spectral power distribution curve 313 is also shown, representing a second discrete radiation source.

In another aspect, multiple continuum radiation sources may be combined to produce a desired spectral power distribution. In one example, an array of one type of continuum radiators may be combined with an array of a second type of continuum radiators. In another example, an array of one type of continuum radiators may be combined with an array of the same type of continuum radiators, wherein the second array is operated under different conditions than the first array. In one case, a first array of incandescent sources with a temperature-dependent spectral power distribution, e.g., tungsten lamps, is operated at a first temperature, and a second array of identical sources is operated at a second temperature. The two operating temperatures are different enough to produce a substantially different spectral power distribution for each array. In another case, a first array of incandescent sources with a pressure-dependent spectral power distribution, e.g., high-pressure sodium lamps, is operated at a first pressure, and a second array of identical sources is operated at a second pressure.

In another aspect, multiple discrete radiation sources may be combined to produce a desired spectral power distribution. In this aspect, no continuum radiation sources are necessary.

In another embodiment, the spectral power distribution of incident radiation is adjusted by a subtractive method to reduce the heating rate of higher absorptivity regions of a substrate surface compared to lower absorptivity regions. To wit, incident radiation may be selectively removed from the spectral power distribution of a radiation source during thermal processing, thus modifying the weighted average fraction of energy absorbed by one or more materials on the same substrate. Therefore, when the removed wavelengths of energy correspond to wavelengths that are preferentially absorbed by a region having a higher heating rate relative to other regions, the variation in heating rates of all regions on the substrate surface is reduced. Desired wavelengths may be removed by positioning one or more optical filters between the radiation source(s) and the surface of the substrate being processed. Filters may include high band-pass, low band-pass and other optical filters. In one aspect, the optical filter may consist of one or more coatings on a quartz window positioned between the radiation source(s) and the surface of the substrate being processed, such as quartz window 215 of lamp assembly 210 illustrated in FIG. 2A.

Figure 3C:
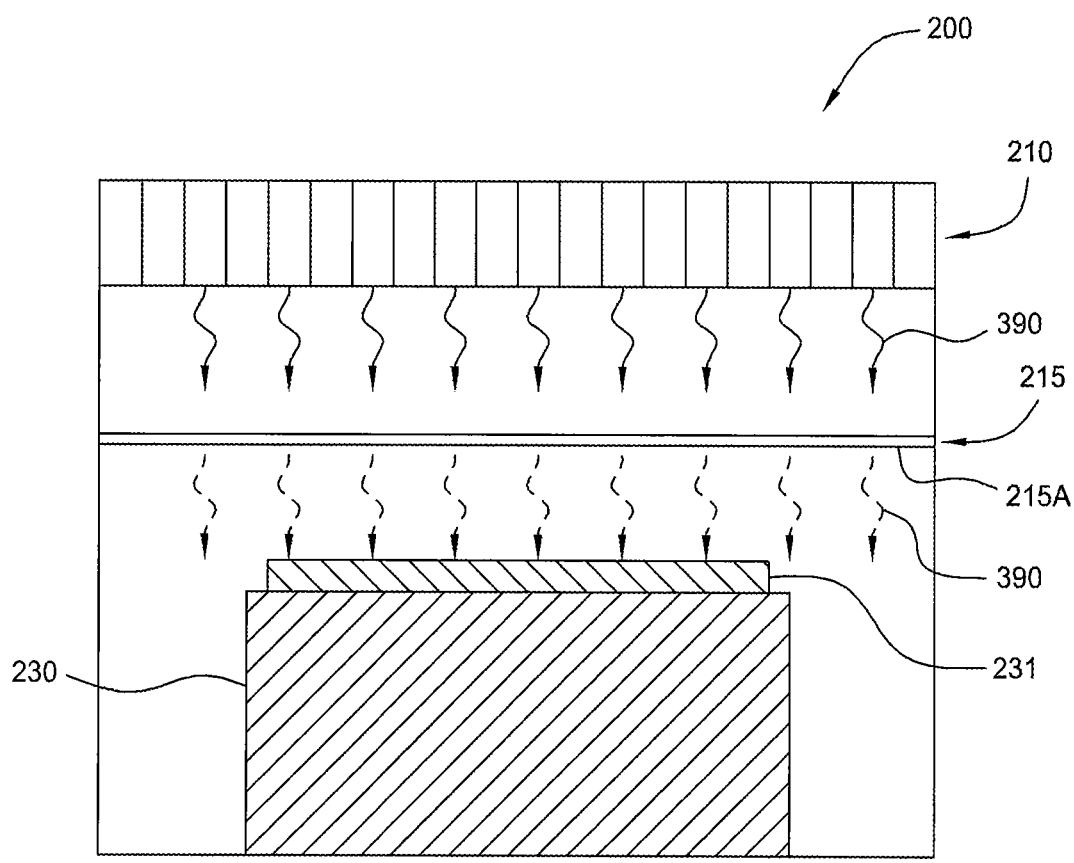
FIG. 3C is a schematic side view of a chamber having an optical filter according to an embodiment of the invention.

FIG. 3C is a schematic side view of chamber 200 having an optical filter according to an embodiment of the invention. In one example, the optical filter is an optical coating 215A disposed on a surface of quartz window 215. In another example, the optical filter may consist of a structure (not shown) independent of quartz window 215 that is positioned between lamp assembly 210 and a substrate 231. In either case, unfiltered radiation 390 is produced by radiation sources positioned in lamp assembly 210 and strikes optical coating 215A or another optical filter medium. Unfiltered radiation 390 may be from one or more continuum sources, one or more discrete sources, or a combination thereof. Radiation of selected wavelengths is then filtered, i.e., absorbed and/or reflected, by optical coating 215A. As a result, only filtered radiation 391 continues through optical coating 215A or other optical filter medium and onto the surface of substrate 231.

Table 1 provides the estimated changes in the weighted average fraction of energy absorbed by three regions 190-192 on the surface of a silicon-based substrate when illuminated by full and by partial spectrum, i.e., filtered, radiation from a standard RTP continuum radiation source. In this example, truncating all radiation from the standard RTP radiation source having a wavelength less than 1 μm produced the partial spectrum radiation. An optical filter positioned between the radiation source and regions 190-192 acted as the truncating filter. Region 190 is a polysilicon region consisting of a 70 nm crystal silicon layer on a 100 nm polysilicon layer. Region 191 is a source/drain region consisting of a 70 nm crystal silicon layer. Region 192 is an STI region consisting of a 70 nm crystal silicon layer on a 100 nm STI oxide.

As indicated in Table 1, by thermally processing regions 190-192 with partial spectrum radiation from a standard radiation source rather than with full spectrum radiation, the emissivity range between regions 190-192 is reduced from 0.088 to 0.058, i.e., 34%. Emissivity range is defined as the variation in emissivity between regions 190-192 during thermal processing. It is generally assumed in the art that the emissivity of a substrate is essentially equal to its absorptivity under most conditions. Therefore, thermally processing regions 190-192 with an appropriate partial spectrum radiation source has been shown to reduce the variation in absorptivity between regions 190-192.

TABLE 1

Comparison of Full Spectrum Emissivity and Partial Spectrum Emissivity

| | Composition | Full Spectrum Emissivity | Partial Spectrum Emissivity (>1 μm) |
|---|---|---|---|
| Region 190 | 70 nm Si/100 nm poly | 0.668 | 0.675 |
| Region 191 | 70 nm Si | 0.668 | 0.675 |
| Region 192 | 70 nm Si/100 nm STI oxide | 0.756 | 0.733 |
| | Emissivity (or Absorptivity) Range | 0.088 | 0.058 |

Because the truncation of wavelengths less than 1 μm with a standard continuum radiation source may result in substantial energy loss, for example on the order of about 30-40% of the unfiltered incident radiation, it may be beneficial to combine the use of an optical filter with other embodiments of the invention. For example, the output of a continuum emitter may be filtered over a relatively narrow range of wavelengths and then combined with the output of multiple radiation sources having different spectral characteristics, as described above in conjunction with FIGS. 3A and 3B. In so doing, a desired spectral power distribution is produced by increasing incident power of a continuum radiation source in one or more wavelengths, and reducing or eliminating the incident power of the continuum source in one or more other wavelengths.

In yet another embodiment, the weighted average fraction of energy absorbed by different regions of a substrate may be adjusted relative to each other by modifying the radiation incident angle. Some or all of the illuminating radiation used to thermally process a substrate surface may be directed at the substrate surface at one or more non-normal angles of incidence.

Figure 1A:
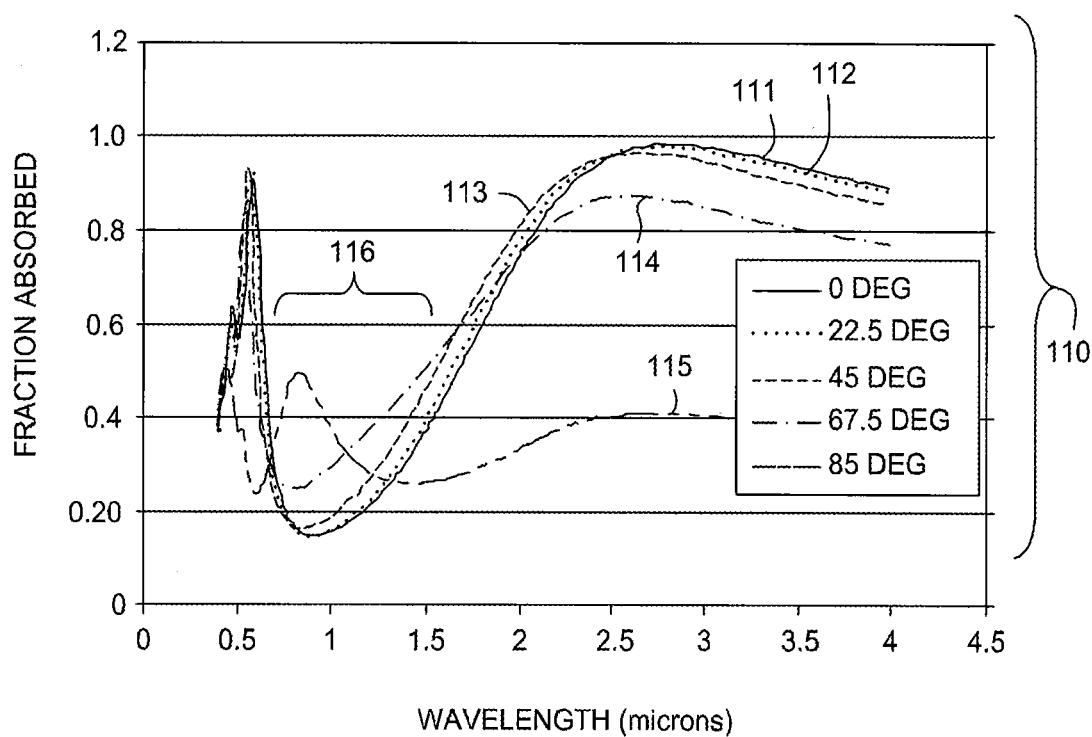
FIG. 1A is a graph illustrating the dependence of the energy absorption of a material on the wavelength and incidence angle of illuminating radiation.
Figure 1B:
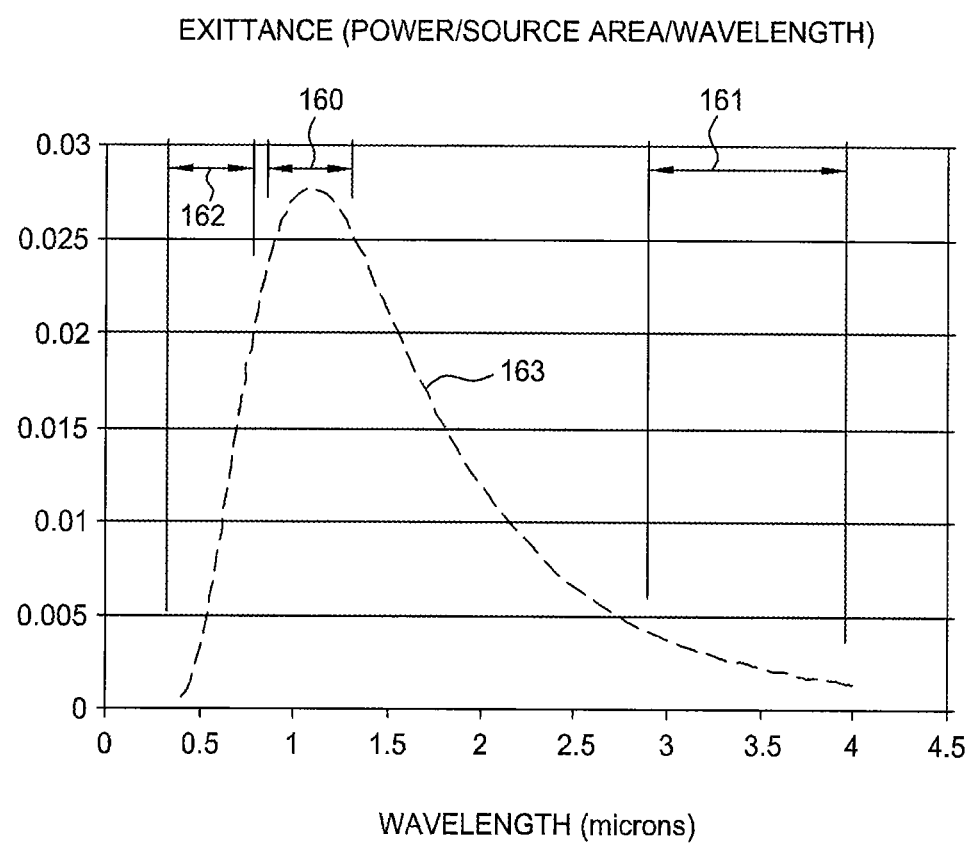
FIG. 1B illustrates a spectral power distribution curve for a typical continuum radiator at a standard operating temperature.
Figure 1C:
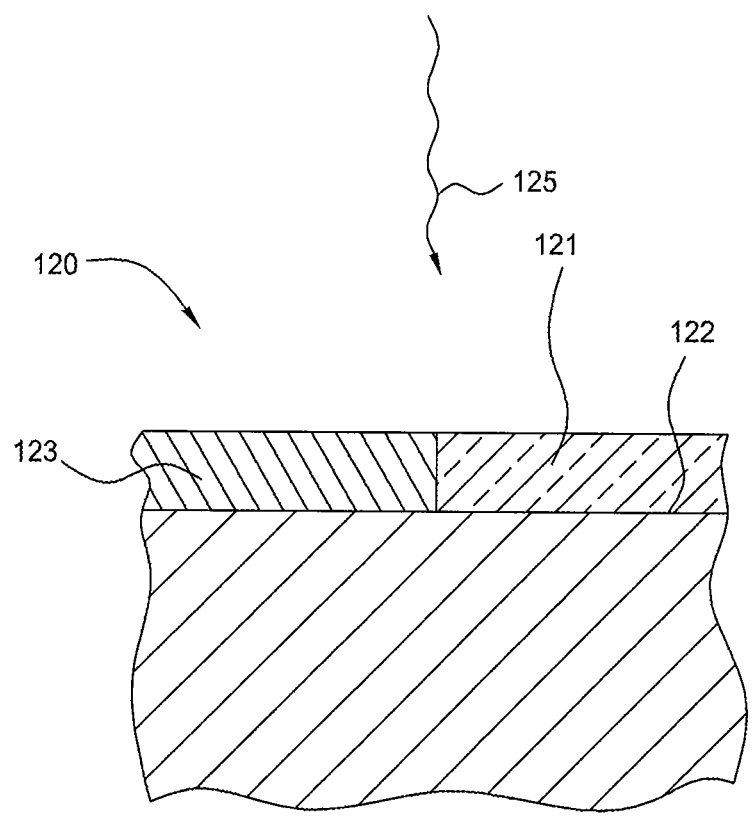
FIG. 1C schematically illustrates a partial cross-section of a silicon substrate having a source/drain region and a film stack region

As noted above in conjunction with FIG. 1A, the fraction of energy absorbed by a substrate is known to be a function not only of wavelength, but also of incidence angle of the illuminating radiation. This absorptive behavior is described by the Fresnel equations, which can be easily applied to film stacks characteristic of structures encountered in semiconductor fabrication. Reasonably simple calculations are possible for a substantially two-dimensional structure. A film structure may be considered to be a substantially two-dimensional structure if there are no horizontal structures present that are on the order of the wavelength of incident radiation. This is often the case with integrated circuit film structures as well as other electronic device film structures.

Because different angles of incidence produce different absorptive behavior for a surface film, variation of the weighted average fraction of energy absorbed, i.e., the effective absorptivity, of different regions or materials on a substrate surface may be reduced. For example, by tailoring the incident angle of illuminating light energy on a substrate, energy may be preferentially added to a lower absorptivity region on a substrate surface by choosing an angle of incidence for some or all illuminating radiation at which the lower absorptivity region has a higher effective absorptivity than other regions. The lower absorptivity region will then experience a relatively higher absorptivity than other regions, producing less variation in the effective absorptivity of all the regions on the substrate surface. Therefore in one aspect, illuminating radiation having different angles of incidence may be directed at the surface of a substrate simultaneously to produce more uniform absorption, and therefore heating rate, of different regions on the surface of the substrate.

In a second aspect, all illuminating radiation used in thermal processing is directed at the surface of a substrate at a single non-normal angle. In one example, an optimal angle of incidence is selected for a given radiation source, so that the absorption curves of the regions of interest on a substrate surface are substantially equal in behavior. In another example, illuminating radiation may be directed at a substrate surface at a highly grazing angle, for example about 85° from the normal. The absorption curves of different film structures and materials are generally uniform when greater than about 1.5 μm in thickness. This is as much as an order of magnitude thicker than the films that are typically processed by radiation-based heating. However, if illuminating radiation is introduced at a highly grazing angle, the effective thickness of such thin films, in terms of absorptivity, may be on the order of 1.5 μm. Therefore, different regions of a substrate surface will absorb the incident light more uniformly when the angle of incidence is at a highly grazing angle.

In another aspect, non-normal illuminating radiation is applied to a substrate in conjunction with adjustment of the spectral power distribution of the radiation source(s) to minimize difference in the weighted average fraction of energy absorbed of different regions on the substrate. Spectral power distribution may be adjusted by an additive method, such as the use of multiple radiation sources having different spectral characteristics. Alternatively, spectral power distribution may be adjusted by a subtractive method, such as the use of one or more optical filters.

In another embodiment, the weighted average fraction of energy absorbed by different regions of a substrate may be adjusted relative to each other by modifying the polarization of incident radiation. Referring back to FIG. 1A, each of absorption curves 111-115 shown therein is actually an average value for two polarization directions, i.e., light polarized within the plane of incidence and light polarized normal to the plane of incidence. In reality, the absorption curves 111-115 for each polarization state are different. Therefore, similar to previously described embodiments, polarization of illuminating radiation may be adjusted to minimize differences in the weighted average fraction of energy absorbed between different regions of a substrate. For example, if the absorption curves for two regions on a substrate surface more uniformly absorb s-polarized than r-polarized light, then only s-polarized light may be directed at the substrate surface for thermal processing. In so doing, there will be less variation in the energy absorbed by each region and therefore less thermal patterning effect.

Because the application of exclusively s- or r-polarized light for radiation-based heating requires sacrificing half of the incident energy for many radiation sources, this embodiment may be beneficially combined with the previously described embodiments of the invention. For example, a beam of incident light may be split into a first and second path. The first path may be directed onto a substrate at a first angle of incidence and the second path may be polarized and then directed onto the substrate at a second angle of incidence in order to compensate for the different absorption curves of various regions on the surface of a substrate. One or both paths may also pass through an optical filter to preferentially remove incident energy of undesired wavelengths. In this way, light that is not optimally polarized may still be used to uniformly heat regions of a substrate surface.

Further, this embodiment may be of particular benefit in radiation-based heating when the radiation source or sources are a naturally polarizing emitter, such as a laser LED. In this aspect, changing the polarization state of the incident radiation may be performed very efficiently, avoiding the large energy losses associated with polarizing naturally unpolarized radiation.

Figure 4:
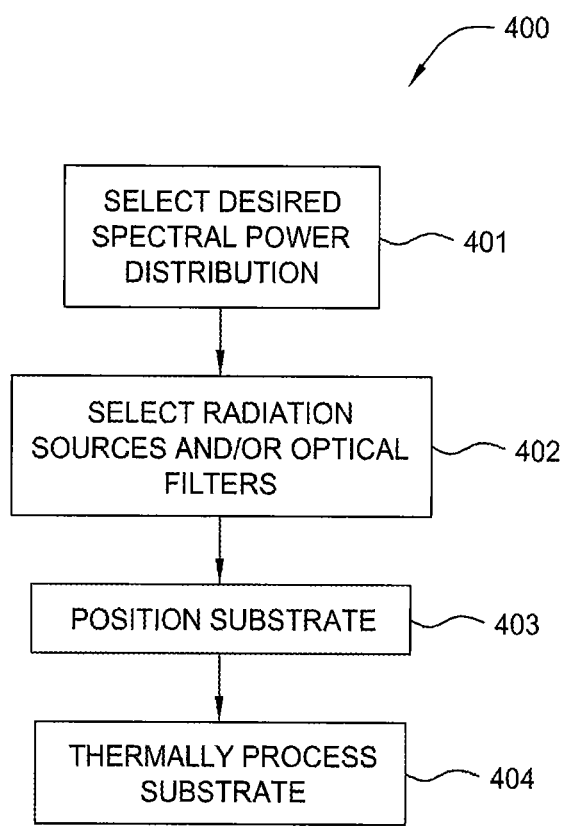
FIG. 4 is a flow chart summarizing a process sequence for diminishing patterning effects on a substrate during radiation-based heating according to an embodiment of the invention.

FIG. 4 is a flow chart summarizing a process sequence 400 for reducing patterning effects during radiation-based heating of a substrate according to one embodiment of the invention.

In step 401, a desired spectral power distribution for incident radiation is calculated to minimize variation in net absorbed power between different regions of a substrate. To obtain the net absorbed power for each region, the average fraction of energy absorbed is weighted according to the incidence angle and wavelengths of the illuminating radiation, as described above in conjunction with FIG. 1A.

In step 402, radiation sources and/or filters are selected to produce the desired spectral power distribution. Incident radiation sources may include a combination of one or more continuum radiation sources with one or more discrete spectrum sources, a combination of multiple discrete spectrum sources, or a combination of continuum radiation sources. In addition, one or more optical filters may be selected to truncate specific wavelengths of incident radiation from one or more of the radiation sources.

In step 403, a substrate is positioned proximate the radiation sources.

In step 404, the substrate is thermally processed with the selected radiation source or sources. The angle of incidence of one or more of the radiation sources may be a substantially non-normal angle of incidence. Incident radiation from one or more of the selected radiation sources may be polarized to further adjust the relative absorbed power of regions on the substrate during thermal processing.

Figure 5:
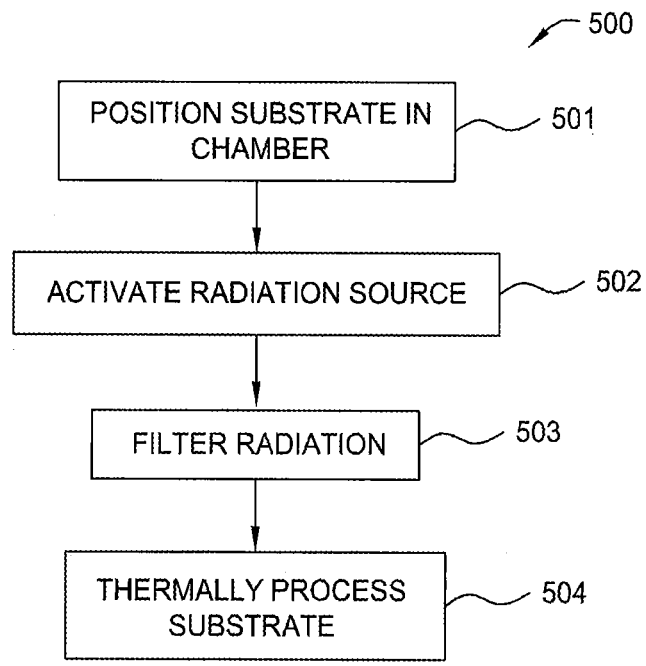
FIG. 5 is a flow chart summarizing a process sequence for thermally processing a substrate according to one embodiment of the invention.

FIG. 5 is a flow chart summarizing a process sequence 500 for thermally processing a substrate according to one embodiment of the invention.

In step 501, a substrate is positioned within a chamber of a substrate processing apparatus, such as chamber 200 illustrated in FIG. 2A. As noted above, chamber 200 has a radiation source, i.e., radiation sources 211, and a window through which radiation from the radiation source enters the chamber, i.e., quartz window 215. The substrate may be positioned by means commonly known in the art, e.g., via substrate transfer robots, or other means.

In step 502, the radiation source, in this example the radiation sources 211, is activated to generate radiation.

In step 503, certain wavelengths of radiation are filtered before reaching the substrate. The wavelengths that are filtered may be reflected off of and/or absorbed by an intervening optical filter positioned between radiation sources 211 and the substrate. In one example, the optical filter is a coating disposed on a surface of quartz window 215. As noted above, optical filters may include high band-pass, low band-pass and other optical filters. In one example of optical filtering, one or more discrete band paths may be filtered. In another example of optical filtering, all wavelengths above or below a certain value may be truncated, e.g., light of all wavelengths less than one micrometer may be prevented from illuminating the substrate.

In step 504, the substrate is thermally processed with the incident radiation, which consists of all radiation produced by radiation sources 211 that is not filtered by the optical filter of chamber 200.

Figure 6:
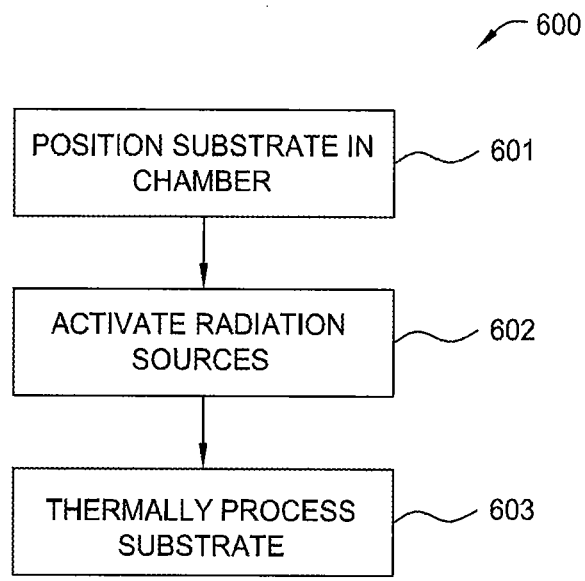
FIG. 6 is a flow chart summarizing a process sequence for thermally processing a substrate according to one embodiment of the invention.

FIG. 6 is a flow chart summarizing a process sequence 600 for thermally processing a substrate according to one embodiment of the invention.

In step 601, a substrate is positioned within a chamber of a substrate processing apparatus, such as chamber 200 illustrated in FIG. 2A. Step 601 is substantially the same as step 501, described above in conjunction with FIG. 5, with the exception that chamber 200 has multiple radiation sources, each producing radiation with different spectral characteristics. As noted above in conjunction with FIG. 2A, the radiation sources may include one or more discrete radiators, one or more continuum radiators, or combinations thereof.

In step 602, the radiation sources, in this example radiation sources 211, are activated to generate radiation having different spectral characteristics.

In step 603, the substrate is thermally processed with the incident radiation.

While the foregoing is directed to embodiments of the present invention, other and further embodiments of the invention may be devised without departing from the basic scope thereof, and the scope thereof is determined by the claims that follow.

What is claimed is:

1. A substrate processing apparatus, comprising:
   a thermal processing chamber;
   a substrate support;
   a source of broad spectrum radiation positioned to direct radiation toward the substrate support; and
   an optical filter comprising a coating on a window positioned between the radiation source and the substrate support, wherein the optical filter removes substantially all wavelengths less than about 1 µm.

2. The apparatus of claim 1, further comprising a source of discrete spectrum radiation.

3. The apparatus of claim 2, wherein the source of discrete spectrum radiation comprises a source selected from the group consisting of a low pressure sodium lamp, a mercury lamp, a metal halide lamp, an atomic emission source, a light emitting diode, and a laser.

4. The apparatus of claim 2, wherein the source of broad spectrum radiation comprises a first honeycomb array and the source of discrete spectrum radiation comprises a second honeycomb array.

5. The apparatus of claim 1, wherein the source of broad spectrum radiation comprises a source selected from the group consisting of a tungsten halogen lamp, a carbon filament lamp, a ribbon lamp, a solid incandescent source, a xenon lamp, a krypton lamp, an argon lamp, and a gaseous incandescent lamp.

6. The apparatus of claim 1, wherein the source of broad spectrum radiation comprises a honeycomb array.

7. The apparatus of claim 6, wherein the honeycomb array comprises a first array comprising a first source of broad spectrum radiation and a second array comprising a second source of broad spectrum radiation having a different spectral power distribution from the first source of broad spectrum radiation.

8. The apparatus of claim 6, wherein the honeycomb array comprises a plurality of reflective light pipes, each light pipe providing a first broad spectrum radiation and a second broad spectrum radiation having a different spectral power distribution from the first broad spectrum radiation.

9. A thermal processing apparatus, comprising:
a thermal processing chamber;
a substrate support;
a lamp assembly having a bottom surface facing the substrate support; and
a coating on the bottom surface of the lamp assembly that removes substantially all radiation wavelengths less than about 1 µm.

10. The thermal processing apparatus of claim 9, wherein the lamp assembly comprises a source of broad spectrum radiation.

11. The thermal processing apparatus of claim 10, wherein the source of discrete spectrum radiation comprises a source selected from the group consisting of a low pressure sodium lamp, a mercury lamp, a metal halide lamp, an atomic emission source, a light emitting diode, and a laser.

12. The thermal processing apparatus of claim 9, wherein the lamp assembly comprises a source of discrete spectrum radiation.

13. The thermal processing apparatus of claim 9, wherein the lamp assembly comprises a source of broad spectrum radiation and a source of discrete spectrum radiation.

14. The thermal processing apparatus of claim 9, wherein the lamp assembly is a honeycomb array comprising a first array and a second array, the first array comprising a first source of broad spectrum radiation and the second array comprising a second source of broad spectrum radiation having a spectral power distribution different from the first source of broad spectrum radiation.

15. The thermal processing apparatus of claim 9, wherein the source of broad spectrum radiation comprises a source selected from the group consisting of a tungsten halogen lamp, a carbon filament lamp, a ribbon lamp, a solid incandescent source, a xenon lamp, a krypton lamp, an argon lamp, and a gaseous incandescent lamp.

* * * * *